United States Patent [19]
Kobayashi et al.

[11] Patent Number: 5,430,522
[45] Date of Patent: Jul. 4, 1995

[54] IMAGE FORMING APPARATUS WITH ENHANCED TRANSPORT OF ITS PHOTOSENSITIVE RECORDING MEMBER

[75] Inventors: Atsushi Kobayashi; Nobumasa Abe, both of Suwa, Japan

[73] Assignees: Seiko Epson Corporation; Seiko Instruments, Inc., both of Japan

[21] Appl. No.: 117,972

[22] Filed: Sep. 8, 1993

Related U.S. Application Data

[63] Continuation of Ser. No. 837,832, Feb. 18, 1992, abandoned.

[30] Foreign Application Priority Data

| Feb. 19, 1991 | [JP] | Japan | 3-024930 |
| Feb. 19, 1991 | [JP] | Japan | 3-024932 |
| Sep. 10, 1991 | [JP] | Japan | 3-230444 |

[51] Int. Cl.$^6$ .............................................. G03B 27/72
[52] U.S. Cl. ................................................... 355/27
[58] Field of Search ................ 355/27, 72, 99, 100, 355/103, 212, 213; 226/111, 112, 195

[56] References Cited

U.S. PATENT DOCUMENTS

| 4,183,658 | 1/1980 | Winthaegen | 355/212 |
| 4,475,805 | 10/1984 | Omi | 355/212 |
| 4,711,562 | 12/1987 | Pothast et al. | 355/212 |
| 4,761,662 | 8/1988 | Yoshimoto et al. | 346/108 |
| 4,777,513 | 10/1988 | Nelson | 355/27 |
| 4,799,085 | 1/1989 | Nagumo et al. | 355/27 |
| 4,819,032 | 4/1989 | Nagumo | 355/27 |
| 4,841,339 | 6/1989 | Taniguchi | 355/27 |
| 4,994,851 | 2/1991 | Iwai | 355/50 |
| 5,028,953 | 7/1991 | Katoh | 355/27 |
| 5,060,008 | 10/1991 | Asai | 355/27 |
| 5,130,744 | 7/1992 | Hisada | 355/27 |

FOREIGN PATENT DOCUMENTS

| 0326080 | 8/1989 | European Pat. Off. . |
| 0350310 | 1/1990 | European Pat. Off. . |
| 0434032 | 6/1991 | European Pat. Off. . |
| 0113957 | 7/1983 | Japan . |
| 147461 | 7/1987 | Japan . |

*Primary Examiner*—Robert B. Beatty
*Attorney, Agent, or Firm*—Harold T. Tsiang

[57] ABSTRACT

A color image forming apparatus includes a primary transport system for moving a photosensitive receiving member of continuous length, which is designed to receive the exposure of an original image to be reproduced forming a latent image of the original at an exposure station. The photosensitive receiving member is transported through the exposure station at a maintained constant rate of movement while assuring the transport of the photosensitive receiving member through downstream stations, involving development of the latent image and transfer of the developed image to an image receiving medium, is accomplished without causing slack, wrinkling or jamming of the photosensitive receiving member in the apparatus or distortion of the developed image during its transfer to an image receiving medium. The control of the transport of the photosensitive receiving member through the apparatus may be accomplished with a combination of a primary transport system and a secondary transport system respectively positioned in the region of the pressure transfer section and downstream of the exposure station to transport the photosensitive receiving member at different rates of movement. Conflict due to different transport rates applied to the photosensitive receiving member is eliminated by establishing a differential motion buffer in the transport path between the primary transport system and the secondary transport system. In this connection, the differential motion buffer provides for slack compensation or tension biasing in conjunction with any slack developed in the transport of the photosensitive receiving member through the apparatus.

3 Claims, 9 Drawing Sheets

IMAGE FORMING APPARATUS WITH ENHANCED TRANSPORT OF ITS PHOTOSENSITIVE RECORDING MEMBER

This is a continuation of application Ser. No. 07/837,832 filed Feb. 18, 1992, now abandoned.

BACKGROUND OF THE INVENTION

This invention relates to the operation of an image forming apparatus, such as, in the case of a photocopying machine, printer, plotter or facsimile machine, wherein images are reproduced by employing a photosensitive, pressure sensitive heat developable film or member and, more particularly, to a color image forming apparatus, such as, image reproducing apparatus, having transport means adapted to control the velocity of the photosensitive receiving member through an exposure station as well as provide for a smooth transport of the member from an exposure station to an image transfer station of the apparatus.

This invention is generally applicable to image forming apparatus wherein the latent image is formed onto a photosensitive receiving member through electrical exposure means, such as, in the case of electronic or electrographic printers, but also is equally applicable to image reproducing apparatus of the type wherein an original image is exposed to a photosensitive receiving member. Thus, as used in this application, "image forming apparatus" relates to any type of such apparatus wherein original images are exposed onto a photosensitive medium. The particular example chosen for explanation of this invention is an image reproducing apparatus is a color photocopying apparatus that utilizes a photosensitive, pressure sensitive heat developable film or member.

An example of a color photocopying apparatus known in the art utilizing a photosensitive, pressure sensitive heat developable film or member is disclosed in Japanese Laid-Open Patent Publication 62-147461. Such apparatus comprises, relative to a defined film transport path, a photosensitive film supply roll, an exposure station wherein the photosensitive receiving film or member is exposed in an image-wise fashion to form a latent image, a heat developing station wherein the photosensitive receiving member is thermally treated to develop the latent image, a pressure transfer mechanism wherein the transfer of a developed image is accomplished from the exposed photosensitive receiving member to an image receiving medium.

In Publication 62-147461, photosensitive receiving member is provided on a supply roll, pulled from the roll and cut into separate sheets of predetermined lengths prior to sequential positioning of the sheets at the exposure station. The sequentially positioned sheets are properly aligned relative to the exposure station and are exposed to a original image to be reproduced. The image may be reflected from an original image and sequentially scanned to form a latent image on the photosensitive receiving member. The development station develops the latent image by heating the photosensitive receiving member to a temperature in the range of about 80° C. to 200° C. for a period of about thirty seconds. The photosensitive receiving member is thereafter advanced to the image transfer station wherein the photosensitive receiving member is aligned and superimposed with an image receiving medium, such as, paper or the like, and the developed image is pressure transferred from the photosensitive receiving member to the image receiving medium. Thereafter, the photosensitive film is separated from the image receiving medium and the spent photosensitive receiving member is guided to a discard bin and subsequently rejuvenated or destroyed.

Because the photosensitive receiving member is severed into individual sheets, a multitude of combination drive and backup rollers are needed throughout the path of movement of the photosensitive receiving member in the apparatus in order to transport the individual sheets along the defined path to and through the several processing stations in the apparatus. The transport system, therefore, comprises drive rollers at the photosensitive receiving member supply roll, the exposure station, the development station, image transfer station and the photosensitive film discard bin in order to properly transport the photosensitive film sheets between and through respective stations. Each drive roller in the system requires a motor or speed reducer as a drive means and a control device to control the drive means. This type of structure and control system wherein a photosensitive receiving member is dispensed from roll type photosensitive receiving member and thereafter cut into predetermined lengths of individual photosensitive sheets results in a complicated and costly drive mechanism structure.

The problems in utilizing an image forming apparatus having a series of photosensitive sheets cut to length has been solved by the employment of a roll type, continuous photosensitive receiving member which is continuously transported between a supply roll and takeup roll in the image forming apparatus remaining in its uncut state. However, further problems are introduced and encountered in the transport of a continuous photosensitive receiving member which require further attention. First, it is essential to maintain the transport velocity of the continuous photosensitive receiving member through the exposure station at a constant rate. Otherwise, since the exposure of the original image and its scanning onto to the moving photosensitive receiving member is being carried at a predetermined scanning rate, any change in the rate of movement of the photosensitive receiving member transported through the exposure station will bring about the formation of distortion in the latent image formed on photosensitive receiving member.

Secondly, in the case wherein the drive means at the exposure station is linked to the drive means at the image transfer station in order to maintain a constant transport velocity concurrently through both of these stations, the transport rate of movement of the photosensitive receiving medium through the exposure station as compared through the image transfer station will differ due to (1) the stretching or shrinkage of the photosensitive receiving member as it is transported through the thermal operated development station, (2) the physical expansion and contraction of the drive roller itself occurring at the image transfer station or (3) image transfer under a pressurized state in conjunction with the image receiving medium in the image transfer station. Therefore, a significant tension state is brought about to the photosensitive receiving member between the exposure station and the image transfer station resulting in slack condition produced on the member which causes the member to become unevenly developed and/or jamming of the member along the transport path. Therefore, it is necessary and desirable to eliminate or control any slack condition of the photosensitive receiving member in addition to providing a slower transport velocity at the image transfer station compared to the transport velocity at the exposure station.

It is an object in this invention to provide an enhanced primary transport system for a photosensitive receiving member of a continuous length through an image forming apparatus.

It is another object of this invention to provide an enhanced transport system for a photosensitive receiving member of a continuous length through an image forming apparatus comprising a primary transport system and a secondary transport system with a differential motion buffer provided between these systems.

It is a further object of this invention to solve the foregoing problems by providing a simplified transport system of a photosensitive receiving member through an image forming apparatus capable of maintaining a constant velocity in the transport of the photosensitive receiving member through the exposure station while providing smooth, continuous transport of the photosensitive receiving member from the exposure station to the image transfer station without causing undesirable slack, wrinkling or jamming of the photosensitive receiving member, or causing distortion in the developed image transfered to the image receiving medium.

SUMMARY OF THE INVENTION

According to this invention, an improved transport system is provided for an image forming apparatus that transports a continuous length of photosensitive receiving member along a transport path wherein the velocity or rate of movement of the photosensitive receiving member through the exposure station is uniformly controlled and, further, tile transfer of the developed latent image to the image receiving medium is accomplished in a smooth and continuous manner without image distortion. This smooth transport of the photosensitive receiving member is accomplished by providing a primary transport system at a image transfer station of the apparatus and, further, the transport velocity of the photosensitive receiving member by the primary transport system through the exposure station is controlled by means of sensing system located in the transport path upstream from the development station of the apparatus. Moreover, a secondary transport system may be located upstream from the image transfer station and is operative to move the photosensitive receiving member at a slightly higher velocity than the transport velocity of the primary transport means. A differential motion buffer is established between the primary and secondary systems to eliminate the conflict of different transport velocities being applied to different regions of the same member moving through the image reproducing apparatus. Also, the transport velocity of the photosensitive receiving member via the secondary transport system through the image transfer station may be controlled by means of a sensing system.

This invention makes it possible to (1) maintain the transport speed or rate of movement of a photosensitive receiving member constant and uniform through the exposure station of the apparatus for accurate image exposure, (2) prevent the transport speed or rate of movement of the photosensitive receiving member downstream from the exposure station from affecting the transport speed or rate of movement of the photosensitive receiving member upstream in the exposure station, and (3) absorb or otherwise control the amount of slack developed in the transport of the photosensitive receiving member through the apparatus thereby facilitating accurate, smooth transport of the photosensitive receiving member throughout the apparatus through the employment of a simple and effective control.

In this invention, a primary transport system is located in the image transfer station of the apparatus for moving the photosensitive receiving member along the entire transport path of the apparatus involving the exposure, development and transfer of images. In this case, a sensor system is employed upstream from the development station of the apparatus for controlling the transport velocity of the photosensitive receiving member through the exposure station by controlling the operation of the primary transport system. In other words, the sensor system controls a transport drive motor at the image transfer station maintaining the rate of movement of the photosensitive receiving member at a constant velocity for accurate image scanning through the exposure station, while facilitating smooth transport of the photosensitive receiving member downstream through the development and image transfer stations thereby improving overall image reproduction quality.

Further, the transport system may be designed as a dual transport means comprising a primary transport system and a secondary transport system respectively active on transport of the photosensitive receiving member along its transport path in separate and different regions of the apparatus. Any mutual interference between these independent transport systems is eliminated by means of differential motion buffer established between the two different regions of member transport in the apparatus. As a result, the transport speed of the photosensitive receiving member can be maintained constant through the exposure station of the apparatus under the control of one transport system and smooth transport can be facilitated by absorbing changes occurring in the member transport speed through the development image transfer stations utilizing the other transport system with an appropriate buffer provided between the two transport systems. Further, with tensioning applied to the photosensitive receiving member, particularly at the point of the differential motion buffer zone, lateral shifting (snaking) or jamming of the photosensitive receiving member in the transport path, primarily due to the employment of a dual transport system, can be prevented thereby facilitating smoother transport of the photosensitive receiving member. Moreover, wrinkling of the photosensitive receiving member is prevented due to the applied tension on the photosensitive receiving member so image development and transfer quality is enhanced.

In one aspect of this invention, illustrated in FIG. 7, the image forming apparatus of this invention transports a continuous length of a photosensitive receiving member along a transport path within an image reproducing apparatus by means of a transport system located at the last processing station of the apparatus which, in the case here, is the image transfer station. The photosensitive surface of the photosensitive receiving member is first presented for image-wise formation at the exposure station of the apparatus by exposing an original image onto the surface of the photosensitive receiving member forming a latent image on its surface as it is uniformly transported through the exposure station. After exposure, the latent image is thermally developed in the development station of the apparatus. The developed image is then transported to the image transfer station wherein the developed image on the photosensitive receiving member is transferred to an image receiving medium under pressure applied to the superimposed image bearing photosensitive receiving member and image receiving medium. In this case, it is desirable that a sensor system detect the transport speed or rate of movement of the photosensitive receiving member be located in the transport path upstream from the development station of the apparatus, e.g., in proximity to the exposure station, and that a controller unit control the transport speed of the primary transport system based on detected member movement by the sensor system.

In another aspect of this invention, illustrated in FIG. 6, dual transport system is provided in the image forming apparatus with a secondary transport system may be provided downstream from the exposure station of the apparatus to transport the photosensitive receiving member at a slightly higher speed or rate of movement through the exposure station over that of the primary transport system at the image transfer station. Such a secondary transport system is located in the member transport path between the development station and the image transfer station of the apparatus. In this particular case, it is desirable that a sensor system detect the transport speed or rate of movement of the photosensitive receiving member be located in the transport path upstream from the heat development station of the apparatus, e.g., in proximity to the exposure station, and a controller unit control the transport speed of the secondary transport system based on detected member movement by the sensor system.

In a further aspect of this invention, illustrated in FIG. 5, such a secondary transport system may be provided downstream from the exposure station of the apparatus to transport the photosensitive receiving, member at a slightly higher speed or rate of movement over that of the primary transport system and, further, the secondary transport system is located in the member transport path at the development station of the apparatus. In this particular case, it is desirable that a sensor system detect the transport speed or rate of movement of the photosensitive receiving member be located in the transport path upstream from the heat development station of the apparatus, e.g., in proximity to the exposure station, and a controller unit control the transport speed of the secondary transport system based on detected member movement by the sensor system.

In a still further aspect of this invention, illustrated in FIG. 2, such a secondary transport system may be provided downstream from the exposure station of the apparatus to transport the photosensitive receiving member at a slightly higher speed or rate of movement over that of the primary transport system and, further, the secondary transport system is located in the member transport path between the exposure station and the development station of the apparatus. In this particular case, it is desirable that a sensor system detect the transport speed or rate of movement of the photosensitive receiving member is located in the transport path upstream from the heat development station of the apparatus, e.g., in proximity to the exposure station, and a controller unit control the transport speed of the primary transport system based on detected member movement by the sensor system.

In an even further aspect of this invention, illustrated in FIG. 4, such a secondary transport system may be provided downstream from the exposure station of the apparatus to transport the photosensitive receiving member at a slightly higher speed or rate of movement over that of the primary transport system and, further, the secondary transport system is located in the member transport path between the photosensitive receiving member supply section and the exposure station of the apparatus. In this particular case, it is desirable that a sensor system detect the transport speed or rate of movement of the photosensitive receiving member be located in the transport path upstream from the heat development station of the apparatus, e.g., in proximity to the exposure station, and a controller unit control the transport speed of the primary transport system based on detected member movement by the sensor system.

In still even further aspect of this invention, illustrated in FIG. 3, such a secondary transport system may be provided downstream from the exposure station of the apparatus to transport the photosensitive receiving member at a slightly higher speed or rate of movement over that of the primary transport system and, further, the secondary transport system is located in the member transport path at the photosensitive receiving member supply section of the apparatus. In this particular case, it is desirable that a sensor system detect the transport speed or rate of movement of the photosensitive receiving member be located in the transport path upstream from the heat development station of the apparatus, e.g., in proximity to the exposure station, and a controller unit control the transport speed of the secondary transport system based on detected member movement by the sensor system.

Furthermore, with respect to at least some of the embodiments of this invention, it is preferable to provide slack compensating means or tensioning means for respectively dealing with the creation of slack in or for applying tension to the photosensitive receiving member in the transport path downstream from the secondary transport system. As an example, the slack compensating means may be a tension roller assembly and the tensioning means may be a tension arm that is biased against the surface of the photosensitive receiving member in a direction substantially perpendicular to the planar extent of the member.

The sensor system may be any suitable means for detecting the rate of movement of the photosensitive receiving member, such as, an optical encoder that utilizes a mechanical roller rotated by the movement of the photosensitive receiving member and includes an apertured disc which rotates with the roller to provide an output pulse stream representative of the rate of movement. Alternatively, equally spaced markings may be provided along one edge of the length of the photosensitive receiving member and optically detected to provide an output pulse stream representative of the rate of movement.

In the case where the primary transport system for transporting the photosensitive receiving member is located in the image transfer station, which is positioned farthest downstream in the transport path relative to major image reproduction processing, transport of the photosensitive receiving member through the member path of the apparatus can be performed by the employment of a single drive means thereby eliminating the need for a direct drive transport of the member at other stations of the apparatus. In this situation, a sensor system is located in the transport path upstream from the development station, i.e., in the exposure station or before or after the exposure section, and the transport speed of the primary transport system is controlled based on detected values from the sensor system whereby the transport speed of the photosensitive receiving member in the exposure station can be continually regulated to a predetermined rate of movement without undesirable slack being created in the transport of the photosensitive receiving member.

By locating a sensor system upstream from the development station plus providing a secondary transport system between the development station and the image transfer station of the apparatus or, alternatively, in the development station, the transport speed of the photosensitive receiving member in the exposure station can be continually regulated to a predetermined rate of movement. Further, the transport zones of the primary transport system and of the secondary transport system can be isolated by means of a differential motion buffer to eliminate any affect of changes or differences in the rate of movement of the photosensitive receiving member in the secondary transport zone or in the primary transport zone. As a result, the maintenance of a constant rate of movement of the photosensitive receiving member through the exposure station can be achieved without being affected by changes occurring to the photosensitive receiving member in the development and image transfer stations. Also, by locating the secondary transport system between the exposure station and the development station of the apparatus, or between the member supply section and the exposure station of the apparatus, the rate of movement of the photosensitive receiving member through the exposure station can be maintained continually constant without the need for any motion detection of the photosensitive receiving member.

Still further, by disposing a sensor system upstream from the development station in addition providing a secondary transport means in the supply section and controlling the secondary transport means based on the output from the sensor system, the transport speed of the photosensitive receiving member in the exposure station can be continually regulated to a predetermined rate of movement. Further, rewinding or recovery of the photosensitive receiving member is facilitated by operating the secondary transport means in a reverse direction. Lastly, by appropriately locating slack compensating means downstream from the secondary transport system, the photosensitive receiving member can be transported between the primary and secondary transport systems under a biased condition thereby preventing the occurrence of or establishment of conditions for creating wrinkles, lateral shifting or jamming of the transported photosensitive receiving member due to the development of an undesirable amount of slack during the course of processing and its movement along the processing path of the image reproducing apparatus.

A further advantage achieved by the present invention is that efficient employment of the photosensitive receiving member is accomplished because the unexposed regions that necessarily-occur between consecutively formed images on the photosensitive receiving member may be made closer due to the accurate transport of the photosensitive receiving member through the stations along the photosensitive receiving member transport path as well as rewind of the member back onto the supply roller for realignment of the unexposed portions at the exposure station.

An overall advantage achieved by this invention is that fewer wrinkles and other imperfections result in the photosensitive receiving member so that higher quality of printed images with consistently good results are accomplished.

Other objects and attainments together with a fuller understanding of the present invention will become apparent and appreciated by referring to the following description and claims taken in conjunction with the accompanying drawings.

DESCRIPTION OF THE PREFERRED EMBODIMENTS

Figure 1:
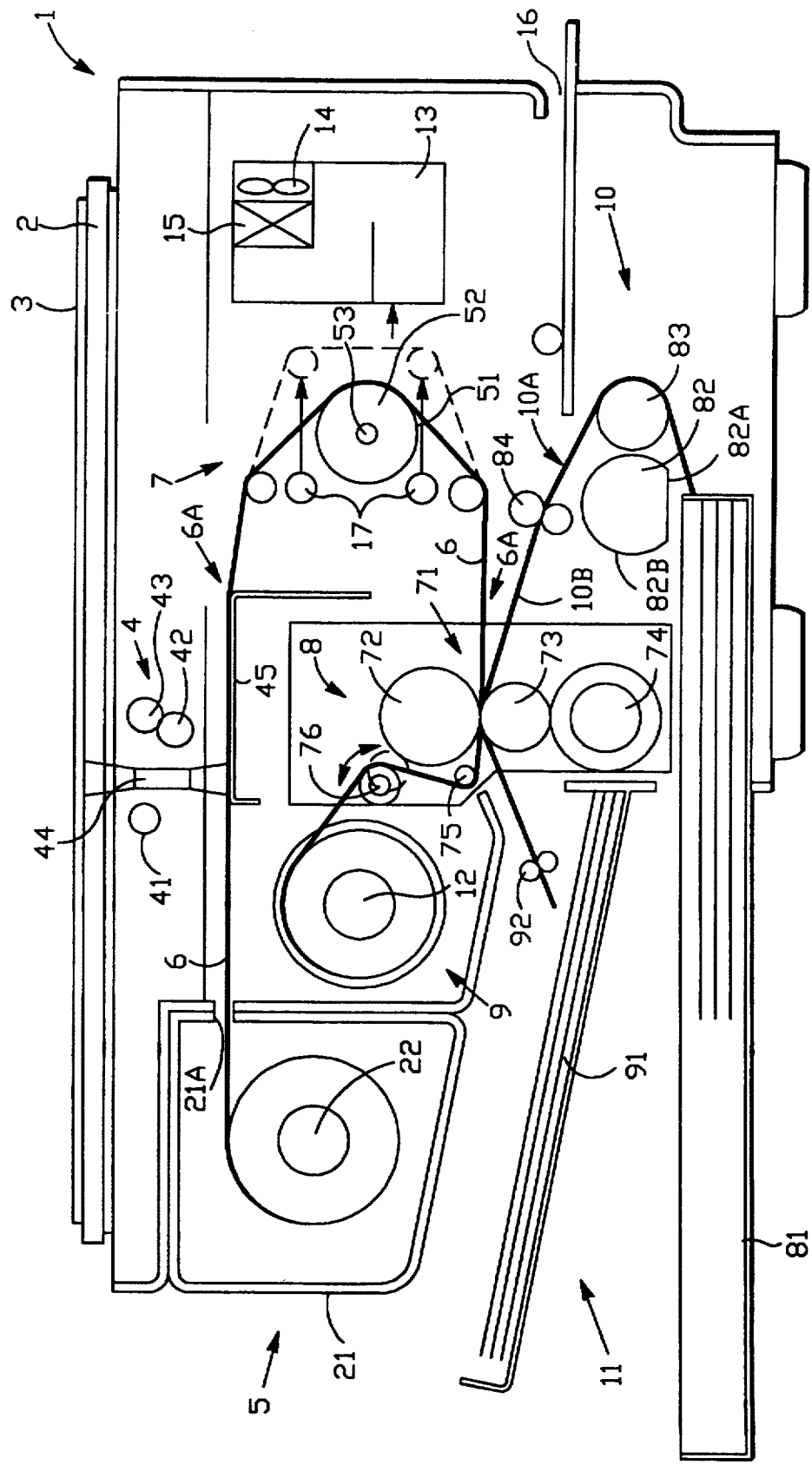
FIG. 1 is a sectional view of color image forming apparatus upon which the embodiments of this invention may be utilized.

Reference is now made to FIG. 1 which illustrates the general configuration of a color image forming apparatus of the type that may be utilized in conjunction with this invention. Image reproducing apparatus 1 comprises a housing with the top portion including a glass exposure platen 2 having a platen cover 3. Within the confines of the apparatus housing is an exposure station 4, a development station 7 and a image transfer station 8. A continuous length of a photosensitive receiving member 6 is provided on a supply roller 22 in supply cartridge 5 and proceeds along a defined transport path 6A for photosensitive receiving member through exposure station 4, development station 7 and image transfer station 8 to takeup roller 12 in photosensitive receiving member recovery section 9. A image receiving medium 10B, such as, a continuous roll of paper or separate sheets of paper, is provided at medium supply section 10 for presentation along a path 10A to image transfer station 7. In the case here, single sheets of paper 10B are feed from medium supply section 10 along medium path 10A guided by a series of drive rollers (explained later) and guide path mechanisms (not shown). The sheet of paper 10B shown in path 10A is proportionately longer in length in order to give a clear indication of the medium path. Images exposed and developed on moving photosensitive member 6, are transferred under pressure contact of photosensitive receiving member 6 superimposed with image receiving medium 10B, and image receiving medium is thereafter transported to the output section 11 of apparatus 1. Stations 4, 7 and 8 are formed substantially in a loop or U-shaped configuration so that apparatus 1 can be formed as a compact unit.

In operation, a supply roller 22 containing photosensitive receiving member 6 is placed in a detachable magazine 21 and is fed out through stations 4, 7 and 8 to takeup roller 12. A color original document is placed on platen 2 beneath platen cover 3 and the color image on the original document is scanned in image-wise formation onto photosensitive receiving member 6 as the latter is moved along transport path 6A below the original document and through exposure station 4. Member 6 with a latent image of the color image on the exposed document formed on its surface is transported along transport path 6A to development station 7 wherein the photosensitive receiving member containing the latent image is heated to a sufficiently high temperature, e.g., 150° C., to thermally develop the latent image in preparation for its transfer to an image receiving medium. The developed image is then transported to image transfer station 8 wherein the developed image is transferred to image receiving medium 10B by means of pressure contact. Finally, photosensitive receiving member 6 and medium 10B are separated and member 6 is taken up onto takeup roll 12 in recovery section 9 while medium 10B is directed to output section 11 of apparatus 1.

Photosensitive receiving member 6 comprises a photosensitive heat-developable, pressure-sensitive type of material having a base film, such as, polyethylene terephthalate (PET) with a surface layer of microcapsules containing photosensitive silver halide, reducing agents, polymer compounds, and coloring materials, such as, disclosed and described in U.S. Pat. No. 4,912,011. This type of photosensitive medium generally has a development temperature within the temperature range of 120° C.-180° C. The coloring materials are contained in the microcapsules and the binder holding the microcapsules to the base film soften more readily at such higher temperatures. The coloring material is provided in the colors yellow, magenta and cyan, and microcapsules of these three color materials are mixed and abundantly applied to the surface of the PET film in a thoroughly mixed condition. In forming a reproduced image, the photosensitive medium undergoes a photo-reaction in exposure station 4 in forming the latent image, and this change in state affects the coloring material when heated at development station 7 so that selective image exposed portions of the formed latent image undergo corresponding selective hardening, i.e., development, so that the coloring material in affected microcapsules are hardened. Film microcapsules are then subsequently crushed under high pressure in image transfer station 8 so that the color material ink of crushed microcapsules unexposed will be in a soften form, having not been thermally hardened, and will be readily transferred to image receiving medium 10B to produce a color image of all original document.

As previously indicated, supply section 5 containing magazine 21 has a continuous length of unexposed photosensitive receiving member 6 supported on roller 12 and is readily attached and detached from apparatus 1. An exposed photosensitive receiving member 6 can subsequently be wound back upon roller 12 in magazine 21 and thereafter discarded. Photosensitive receiving member 6 is continuously unrolled from supply roller 22 with its photosensitive surface up and is supplied through slit 21A in magazine 21 to exposure station 4 located downstream from section 5.

Exposure station 4 includes a red lamp 41, a green lamp 42 a blue lamp 43, a convergence lens 44, and an exposure backplate or platform 45 over which travels photosensitive receiving member 6. Lamps 41, 42 and 43 irradiate light toward the original document positioned on platen 2 by means of a reflector (not shown), and the light reflected from the original document is optically converged onto the surface of photosensitive receiving member 6 by lens 44 with the use of a shutter (not shown) whereby exposure of photosensitive receiving member 6 in image-wise formation is performed. In this particular embodiment, the original document moves forward and then backward with platen 2, and, concurrently, photosensitive receiving member 6 is advanced at the same speed or rate of movement as the forward motion of platen 2.

Downstream from the exposure station 4 is development section 7 comprising a heating roller 51 which serves as a heat source for hardening of previously exposed photosensitive microcapsules on member 6. Heating roller 51 comprises main roller unit 52 which is supported on a frame (not shown) of apparatus 1 and is mounted to be freely rotatable. Roller 52 is heated by halogen lamp 53 mounted inside the roller core. Lamp 53 is employed only for heating purposes, and other types of heating means may be employed, such as, with an infrared heater, a rod-shaped ceramic heater, a sheet-formed heating element, an electrode induction heating system, an electromagnetic wave heating system, or the like. The temperature at the surface of roller 51 is controlled by operating the on and off state of halogen lamp 53 such that a steady state temperature of around 150° C. is maintained at the surface of development roller 51. The backside surface of member 6 contacts through an arcuate wrap angle a portion of the outside surface of roller 51 as member 6 rotates with roller 51. Photosensitive receiving member 6 is heated to a sufficiently high temperature to bring about proper development of the latent image. Member 6 is wound around roller 51 over a predetermined arc length so it will be properly heated to the correct temperature over an adequate period of time.

Photosensitive receiving member 6 proceeds further downstream to image transfer station 8 including transfer roller assembly 71 comprising a motor driven top roller 72, central roller 73, and bottom roller 74. Rollers 72 and 73 may be made of metal or other significantly hard material. This arrangement of rollers is complemented by separation roller 75 and pinch roller 76. Record medium 10B, such as, a sheet of paper, is supplied from medium supply section 10, and member 6 and medium 10B are pressed together between top roller 72 and central roller 73. The transfer temperature is preferably around 70° C. The rate of movement at which heated member 6 is advanced from development station 7 to image transfer station 8 is such that it permits sufficient cooling of member 6 to such a lower temperature by the time it reaches image transfer station 8.

The transfer of the image from member 6 to image receiving medium 10B is performed by crushing the microcapsules on the surface of member 6 due to the pressure applied between rollers 72 and 73. In order to obtain a successful image transfer, it is necessary to apply a significantly large, uniform pressure to photosensitive receiving member 6 and medium 10B. Bottom roller 74 is in contact with central roller 73 so that a uniform pressure can be applied by roller 74 directly to middle roller 73. Desirable relationships of image transfer pressure to image transfer temperature are as follows: 1000 kg/cm$^2$ at 20° C., 400 kg/cm$^2$ at 50° C., 200 kg/cm$^2$ at 70° C. and 100 kg/cm$^2$ at 90° C. Also, when image transfer is not being performed, central and bottom rollers 73 and 74 may be laterally translated downward away from top roller 72 to a retracted position.

Separation roller 75 is positioned adjacent to the downstream side of transfer roller assembly 71, and at this point, photosensitive receiving member 6 and paper 10B are forcibly separated by redirecting the transport path of the photosensitive receiving member 6 sharply away from the established path of travel through station 8. Thereafter, photosensitive receiving member 6 is transported to rotatably supported pinch roller 76, which may be moved into and out of contact with top roller 72, as indicated by the arrow and dotted line position of the roller shown in FIG. 1. As a result, photosensitive receiving member 6 is sandwich between pinch roller 76 and top roller 72 thereby directly applying a transport force to photosensitive receiving member 6 for takeup on roller 12. In other words, pinch roller 76 is a freely rotatably supported roller which is movable against top roller 72, which thereby functions as a drive roller on member 6. As a result, photosensitive receiving member 6 is received between rollers 72 and 76 so that a transport force is applied to it for positive transport of member 6 as well as aiding in the pealing away member 6 from medium 10B at separation roller 75. As previously indicated, separated photosensitive receiving member 6 is then directed into photosensitive receiving member recovery section 9 by pinch roller 76 where it is taken up upon takeup roller 12.

When all of the continuous length of photosensitive receiving member 6 has been removed from supply roller and wound onto takeup roller 12, a clutch (not shown) disengages roller 12 from take up drive means so that roller 12 is placed in a freely rotatable state. Then, a drive means for roller 22 is reversed and member 6 is fed back and rolled into magazine 21.

Medium supply section 10 providing paper 10B to image transfer station 8 comprises a paper cassette 81 wherein cut sheets of paper 10B are for feeding to station 8. Half-moon roller 82 is designed to feed paper from paper cassette 81, one sheet at a time. Guide roller 83 changes the direction of the feed path of paper 10B and the sheet of paper 10B is guided by rollers 84 to image transfer station 8. Supply cassette 81 is configured such that it can be freely attached to and detached from apparatus 1. Further, section 10 is adapted to handle multiple cassettes in order to accommodate different sizes of paper medium. Half-moon roller 82 comprises an elongated flat portion 82A and a curved portion or crown 82B, and these surface portions are provided with a rubber surface for paper gripping purposes. The transition edge formed between flat portion 82A and crown portion 82B grips the leading edge of paper 10B, and the crown portion 82B feeds paper 10B out of cassette 81 until its leading edge reaches paper supply roller 84 wherein the paper sheet is gripped and transported to station 8. The supply of sheet paper 10B is initiated in synchronism with exposed image portions of the transported photosensitive receiving member 6 in a manner that sheet paper 10B is properly aligned with exposed and developed images formed on photosensitive receiving member 6 for transfer to paper 10B.

Output section 11 comprises output tray 91 and output rollers 92, which guide an imaging bearing sheet of paper 10B from image transfer station 8 to output tray 91. Output rollers 92 are driven so as to feed paper 10B at a slightly faster rate than driven supply rollers 84 so that the resulting developed slip rotation at rollers 92 transport paper 10B while concurrently applying tension to the paper so that it will not wrinkle or become jammed during pressure transfer of an image at station 8.

Apparatus 1 includes a ventilation system 13 having an air filter 15 and exhaust fan 14. System 13 exhausts hot air and other gases developed during operation of apparatus 1, which are properly and ecologically filtered through air filter 15, and fan 14 exhausts the filtered air to the exterior of the apparatus. Intake section 16 allows a sheet of paper to be fed in manually.

The reproduction process of apparatus 1 depends on the appropriate image exposed portion of member 6 reaching the image transfer station 8 for transfer of the image to paper 10B. Continuous reproduction of images sequentially along a given length of member 6 is less of a problem than a single exposure reproduction wherein only one image is scheduled for printing because unexposed regions of member 6 leading and trailing the single exposed image portion are undesirably wasted. To reduce this waste of unexposed portions of member 6, the unexposed portions of member 6 are returned to the region of exposure station 4 by reversing the direction of transport of member 6 through apparatus 1. In this regard reference is made to FIG. 2 wherein supply drive motor 102, coupled to drive roller 22, drives member 6 in a reverse direction onto roller 22 until the leading edge of an unexposed portion of member 6 has reached exposure station 4 and, more particularly, until tile boundary defined between the exposed image portion and the trailing unexposed portion reaches the vicinity of exposure station 4, e.g., adjacent to the rearward edge of platform 45. During the next image reproduction cycle, contact between heated roller 51 and previously exposed portions of member 6 is prevented through operation of a pair of rotatably mounted idler rollers 17 positioned oil adjacent sides of development roller 51. Rollers 17 are laterally shifted against the undersurface of member 6, as indicated by the arrows in FIG. 2, in the vicinity of its wrap around development roller 51. As a result, the previously exposed portion of member 6 is moved laterally away from and beyond the surface of roller 51 while member 6 is advance through station 7. Thus, the lateral translation of idler rollers 17 is deployed whenever contact between member 6 and heated roller 51 is undesirable or is not required, such as, in the case of rewind of member 6 to reposition unexposed portions of member 6 relative to exposure station 6 or, further, in the case of full rewind of member 6 onto supply roller 22 for removal from apparatus 1.

Photosensitive receiving member 6 may be transported through apparatus 1 by means a primary transport system which is preferably at image transfer station 8, which is illustrated later in connection with the embodiment shown in FIG. 7. However, particular reference is now made to a transport system employed in the transport of member 6 through apparatus 1 at two different rates of movement without conflict. The rate of motion of member 6 through exposure station 4 must be maintain constant. Furthermore, the rate of movement of member 6 downstream of exposure station 4 may be preferred at a slower rate of movement due to shrinkage of the photosensitive receiving member or clue to changes brought about by thermal expansion of rollers at image transfer roller assembly 71. Any treatment via pressures applied to member 6 in image transfer station 8 should not be allowed to affect the rate of movement of member 6 through exposure station 4. Furthermore, any slack formed in transport path 6A by member 6 due to its slower rate of movement downstream should be monitored and thereafter absorbed or controlled. The embodiments to be discussed herein are directed to the foregoing concerns and provide for their solution.

Figure 2:
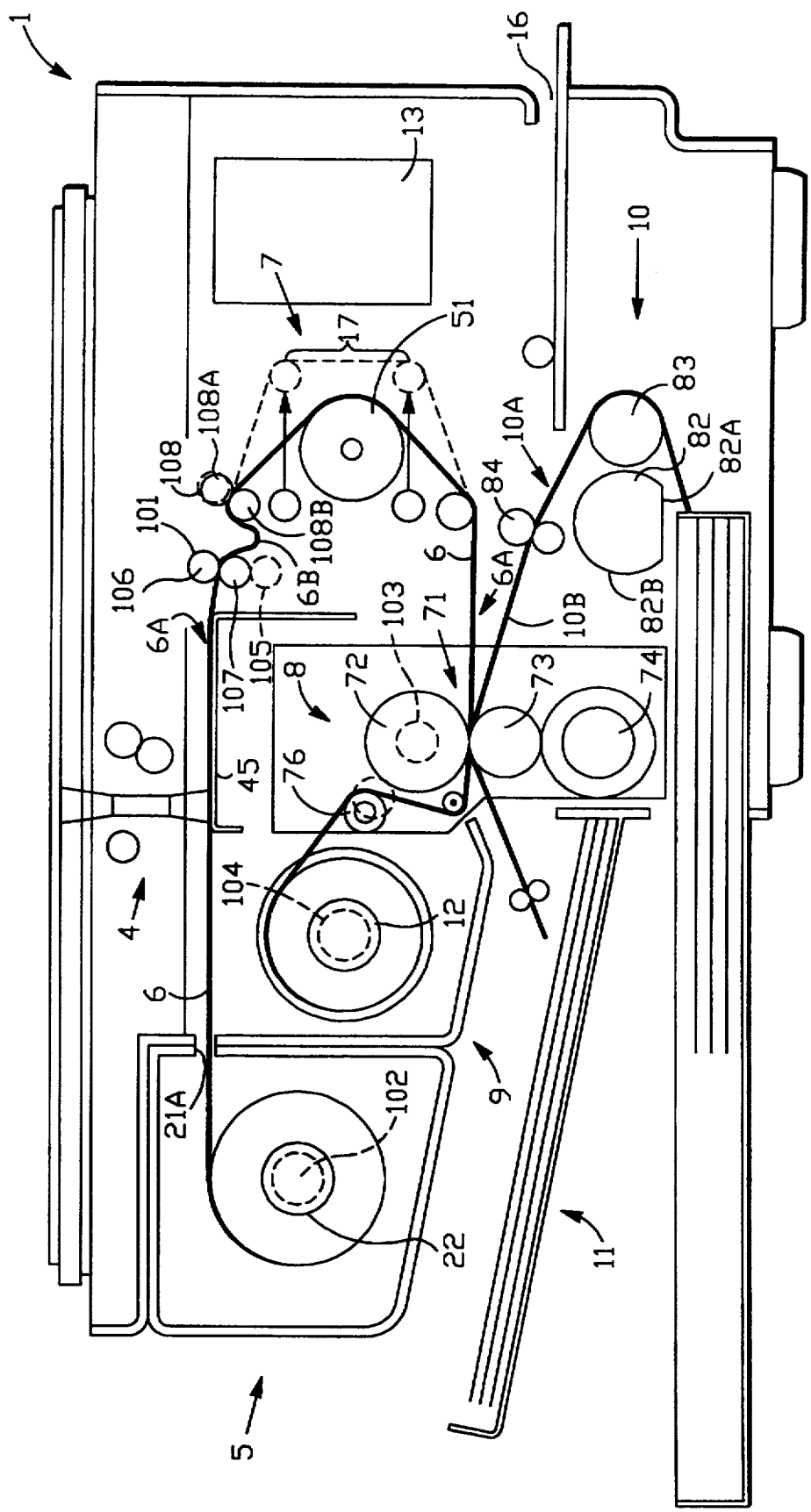
FIG. 2 is a sectional view of color image forming apparatus illustrating a first embodiment of this invention.

Continuing with reference to FIG. 2, which illustrates a first embodiment of this invention, the advancement of member 6 through exposure station 4 is accomplished by forward feed roller assembly 101, which is a secondary transport system of apparatus 1. The primary transport system for photosensitive receiving member 6 is drive motor 103 connected to drive top roller 72 which, in turn, drives central roller 73 between which member 6 and medium 10B are driven along transport path 6A. Thus, the forward advance of member 6 upstream at exposure station 4 is accomplished at a first rate of movement, via feed roller assembly 101, versus downstream transport of member 6 which is accomplished at a second rate of movement through stations 7 and 8 by means of drive motor 103 via top roller 72 in assembly 71. These primary and secondary transport systems with their different rates of movement to member 6 are isolated from one another by means of a differential motion buffer which prevents the development of conflict between these different transport systems to the detriment of photosensitive receiving member 6. In the embodiment of FIG. 2, this buffer is in the form of tension roller assembly 108. Roller assembly 108 functions as slack compensating means by establishing a small amount of slack or a slack loop 6B in member 6 between feed roller assembly 101 and tension roller assembly 108. Thus, the combination of driven top roller 72 on one portion of member 6 and driven feed roller assembly 101 on another portion of member 6 can, therefore, cooperatively bring about the transport of member 6 through respective stations 4, 7 and 8 without conflict, even though the upstream transport of member 6 through exposure station 4 is accomplished by another, separate drive means operating to transport member 6 at a faster rate of movement compared to that of the downstream transport of member 6. As a result, tearing of photosensitive receiving member 6 can be prevented since tension formed on member 6 due to the application of different applied drive rates to member 6 is prevented due to isolation of the conflicting affects of resulting different drive forces.

Roller 12 includes takeup drive motor 104 which operated at a constant speed. In this case, since photosensitive receiving member 6 is taken up upon a roll, it is necessary to take into consideration a change required in takeup speed due to a continuous incremental increase in its roll diameter. To compensate for this factor, a torque limiter is provided on takeup roller 12, and, therefore, changes in speed are absorbed through slippage of the torque limiter.

Feed roller assembly 101 comprises roller 106 for forcibly driving member 6, which is driven by motor driven roller 105 as applied against pressure roller 107 which, in turn, pinches member 6 between pressure roller 107 and driver roller 106. Motorized roller 105 is driven by a constant speed motor in order that member 6 travels at a constant rate of movement over exposure platform 45 in order to obtain uniform exposure of images scanned onto the moving member. Thus, member 6 travels at a constant speed along the transport path through the exposure station during both exposure and non-exposure periods. As an important feature of this invention, feed roller assembly 101 is driven at a slightly faster rate than transfer roller assembly 71. As a result, a small slack condition 6B is created in member 6 between feed roller assembly 101 and transfer roller assembly 71. This slack or loop condition 6B does not present a problem in the transport of member 6 through apparatus 1 if the amount of slack loop 6B is maintained small. Large amounts of slack or a large slack loop can result in lateral shifting of member 6 in its transport path 6A of travel or jamming in the transport path 6A, particularly at points of transport roller contact. Thus, tension roller assembly 108 is employed to control the amount slack developed and maintains slack loop 6B to a small amount.

Tension roller assembly 108 comprises a pair of upper and lower idler rollers 108A and 108B. A torque limiter (not shown) is coupled to the shaft of idler roller 108A. A predetermined amount of tension is applied to member 6 by adjusting the damping torque of the torque limiter. As a result, photosensitive receiving member 6 is maintained in a taut condition in transport path 6A between tension roller assembly 108 and image transfer station 8. Through this tensioning mechanism, photosensitive receiving member 6 downstream from tension roller assembly 108 and to image transfer station 8 is in a continuous taut condition thereby preventing lateral shifting or jamming of member 6 while aiding in preventing its wrinkling in stations 7 and 8.

Thus, in summary, upstream from tension roller assembly 108, slack loop 6B in photosensitive receiving member 6 is developed due to the applied difference in transport rates of movement between feed roller assembly 101 and driven transfer roller assembly 71 resulting in a differential motion buffer between these different drive or transport systems. Because of the creation of this differential motion buffer, transfer roller assembly 71 need not be driven in synchronization with the transport of photosensitive receiving member 6 through exposure station 4, even in the case where member 6 is frequently stopped and started. On the other hand, transfer roller assembly 71 and development roller 51 can be continuously driven in spite of intermittent stopping and starting of the member through exposure station 4 since there is sufficiently available portion of photosensitive receiving member 6 present in slack loop 6B.

Reference is now made to the operation of the dual transport system for member 6 in conjunction with the transport of paper 10B. Feed roller assembly 101 commence operation for driving member 6 at the beginning of each exposure cycle for forming an original image onto photosensitive receiving member 6 via image scanning of the original at exposure station 4. With the operation of feed roller assembly 101, photosensitive receiving member 6 is spooled from magazine 21 over platform 45. Pinch roller 76 moves in contact with top roller 72, which is operated after a small delay after the beginning of the exposure cycle. Takeup roller 12 is driven by motor 104 in tandem with the operation of top roller 72 by motor 103, and pinch roller 76 is moved into contact with the surface of roller 72.

An exposed region of photosensitive member 6 containing a latent image of the original is transported along transport path 6A by top roller 72 through development station 7 and image transfer station 8. When a developed image is in close proximity to image transfer station 8, pickup roller 82 is rotated to feed out a sheet of paper 10B. Paper supply rollers 84 aid in alignment of paper 10B with the developed image formed on member 6. Extended articulation of rollers 17 is performed when an unexposed portion of member 6, trailing the exposed latent image region, reaches development station 7. Further, when the same unexposed trailing portions of member 6 reach image transfer station 8, the central and bottom rollers 73 and 74 are translated away from top drive roller 72 terminating any possible operation of image transfer and microcapsule crushing of the unexposed trailing portion present at station 8. When paper 10B has passed onto section 11, one image reproduction cycle has been completed and transport of member 6 as well as all drive roller operation is terminated. At this point, pinch roller 76 is moved away from top drive roller 72, and extended rollers 17 remain in their extended position to maintain member 6 spatially separated from development roller 51. Clutch mechanisms (not shown) provided at tension roller assembly 108, pinch roller 76, and takeup roller 12 are operated to allow these rollers to be placed in a freely rotatable state, and the operation of motor 102 brings about the reverse driving of supply roller 22 takeup member 6 onto roller 22 for repositioning of the unexposed portion of member 6 at exposure station 4.

Figure 3:
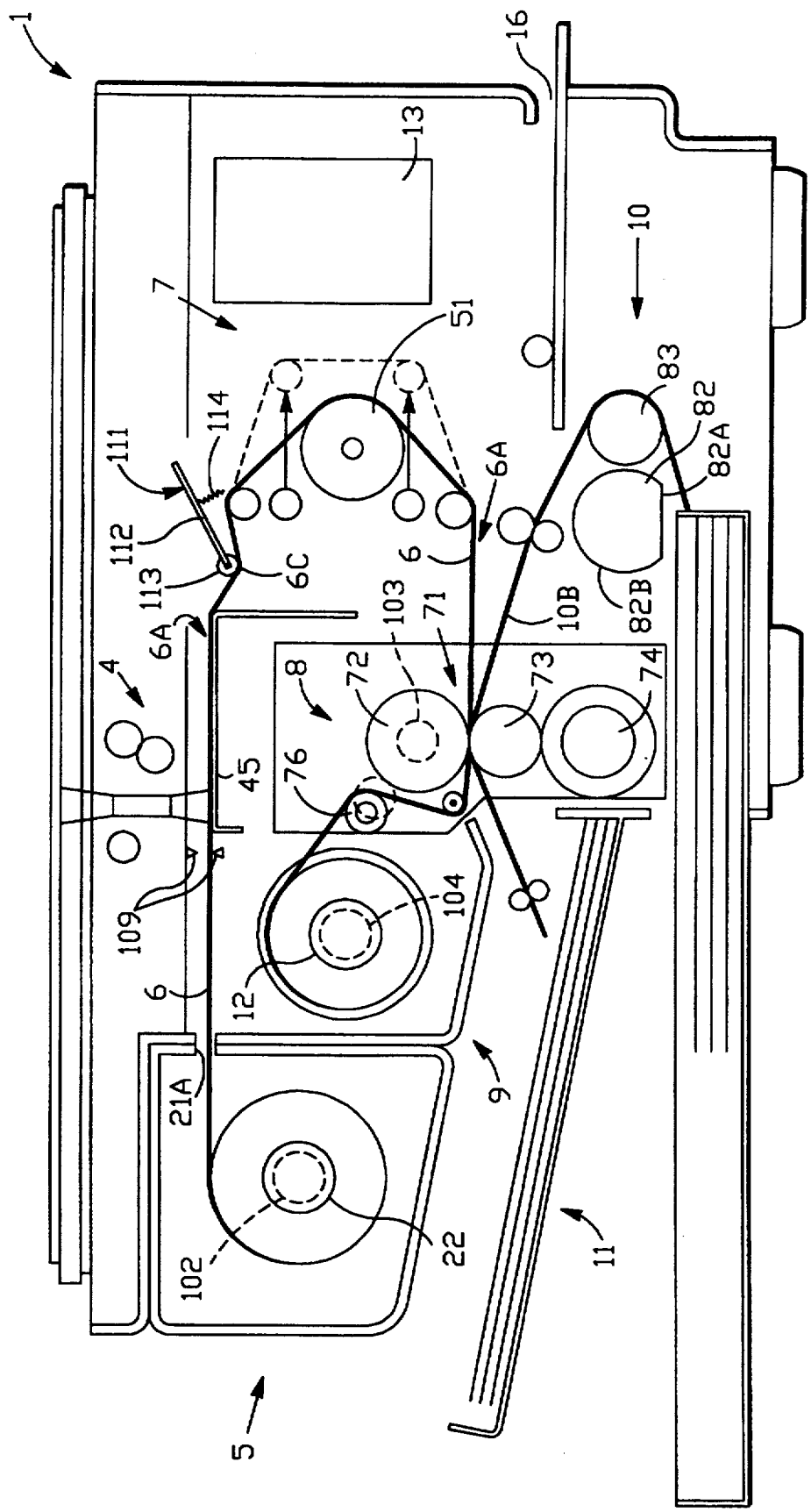
FIG. 3 is a sectional view of color image forming apparatus illustrating a second embodiment of this invention.

In FIG. 3, a second embodiment of this invention is illustrated wherein supply drive motor 102 comprises a variable speed type motor. The movement of photosensitive receiving member 6 is detected by sensor system 109 positioned immediately upstream of exposure platform 45. As in the case of the first embodiment, the transport system of apparatus 1 comprises drive motors 102, 103 and 104 respectively connected to drive supply roller 22 of supply section 5, top roller 72 of image transfer station 8 and takeup roller 12 of photosensitive receiving member recovery section 9. However, in this embodiment, motor driven top roller 72 is the primary transport system for photosensitive receiving member 6, while motor driven supply roller 22 is the secondary transport system of apparatus 1. In other words, supply drive motor 102 is a variable speed motor and the transport velocity of photosensitive receiving member 6 is-detected by sensor system 109 positioned upstream from exposure station platform 45. Supply drive motor 102 is controlled based on detection via sensor system 109 whereby the transport velocity of photosensitive receiving member 6 is uniformly maintained through exposure station 4. The slack produced in photosensitive receiving member 6 due to the difference in the rate of movement between supply roller 22 and top roller 72 is attended to by slack compensating means in the form of biased tension arm unit 111 positioned between exposure station 4 and development station 7.

Tension arm unit 111 comprises main arm 112, which is rotatably mounted at its upper end to a frame (not shown) of apparatus 1. The lower end of arm 112 rotatably supports pressure roller 113. Biasing means in the form of coil spring 114 biases arm 112 against the upper surface of photosensitive receiving member 6 in order to gently force the member downwardly into apparatus 1, i.e., in a direction substantiality perpendicular to the direction of travel of member 6, as indicated at 6C, thereby providing an effective means for absorbing the slack formed in photosensitive receiving member 6 due to the difference in transport speeds of driven rollers 22 and 72. As a result, the transport velocity of photosensitive receiving member 6 traveling over the platform 45 can be maintained uniform by supply drive motor 102 while employing unit 111 as a differential motion buffer.

Figure 4:
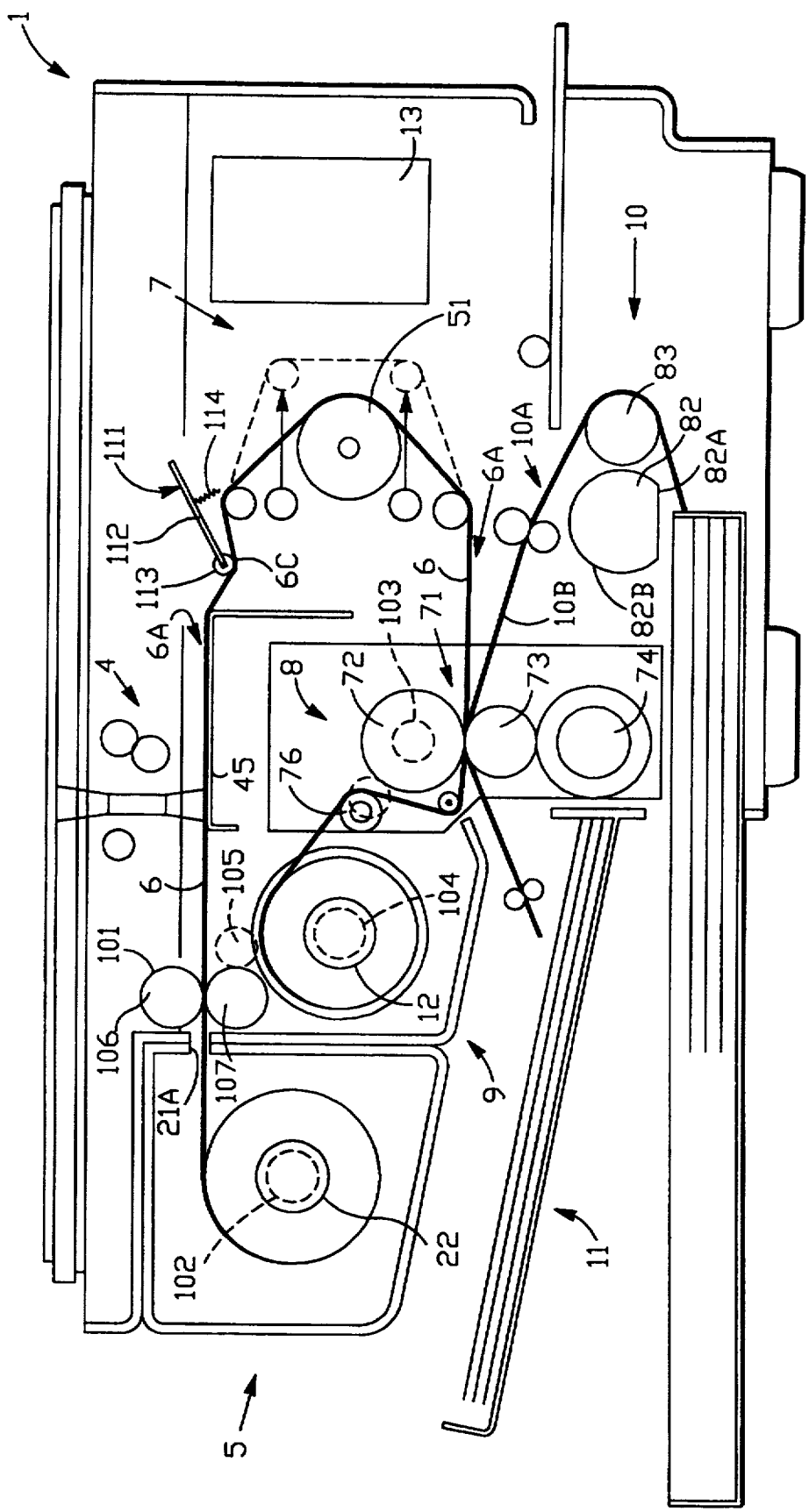
FIG. 4 is a sectional view of color image forming apparatus illustrating a third embodiment of this invention.

A third embodiment of this invention is shown in FIG. 4 wherein apparatus 1 is substantially the same as that shown in the second embodiment of FIG. 3, except that feed roller assembly 101 of the first embodiment of FIG. 2 is utilized in this embodiment. However, feed roller assembly 101 is positioned at another location in transport path 6A between supply cartridge 5 and exposure station 4. As in the case of the first embodiment, drive roller 106 of feed roller assembly 101 in conjunction with pressure roller 107 operates at a slightly higher velocity compared to top roller 72. Continuously uniform movement of member 6 can be maintained in exposure station 4 without the need for a photosensitive receiving member velocity sensor, such as, sensor system 109 employed in the second embodiment.

Figure 5:
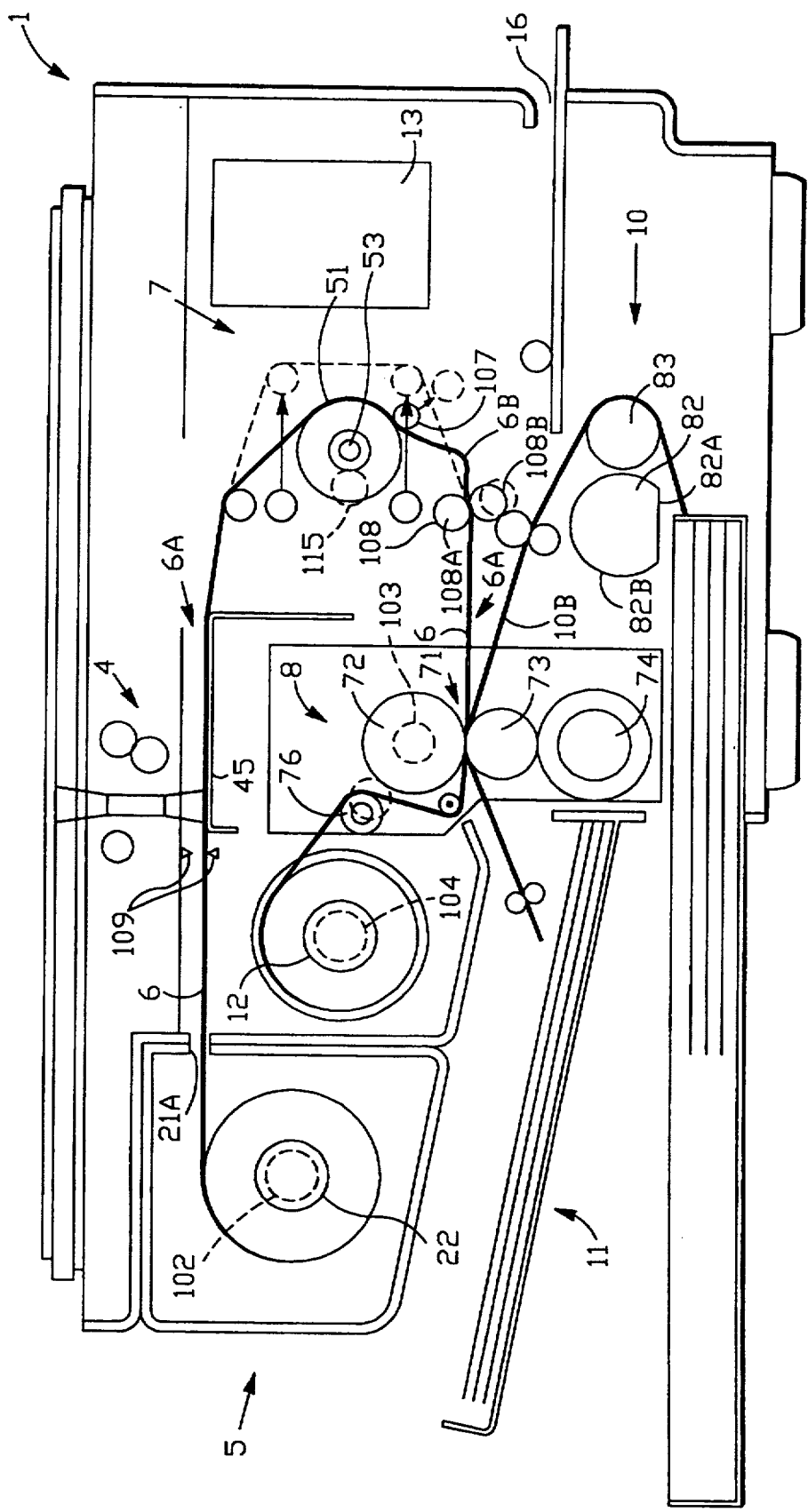
FIG. 5 is a sectional view of color image forming apparatus illustrating a fourth embodiment of this invention.

In FIG. 5, a fourth embodiment of this invention is disclosed. In this embodiment, drive motor 115 is coupled to drive development roller 51. Pressure roller 107 is provided at station 7 and is positioned to be placed in or out of engagement with the surface of roller 51 so that photosensitive receiving member 6 may be held between the surface of roller 51 and roller 107. As a result, motor 115, in combination with engagement roller 107, constitute a secondary transport means at station 7 for photosensitive receiving member 6. Motor 115 is a variable speed motor so that the transport velocity of photosensitive receiving member 6 in the exposure station 4 is detected by sensor system 109 upstream from exposure station 4, and the rotational drive velocity of drive motor 115 is varied to maintain a predetermined constant velocity of member 6 through exposure station 4. In particular, the rotational velocity of drive motor 115 is varied in a manner that the velocity of photosensitive receiving member 6 in exposure station 4 is maintained higher than the velocity of member 6 through image transfer station 8 in spite of any shrinkage of photosensitive receiving member 6 in development station 7. As in the case of the first embodiment, tension roller assembly 108 is disposed in transport path 6A downstream from development roller 51 and pressure roller 107 so that photosensitive receiving member 6 is transported to image transfer station 8 under tension while forming a differential motion buffer is provided between secondary drive means 115 and primary drive means 103.

Figure 6:
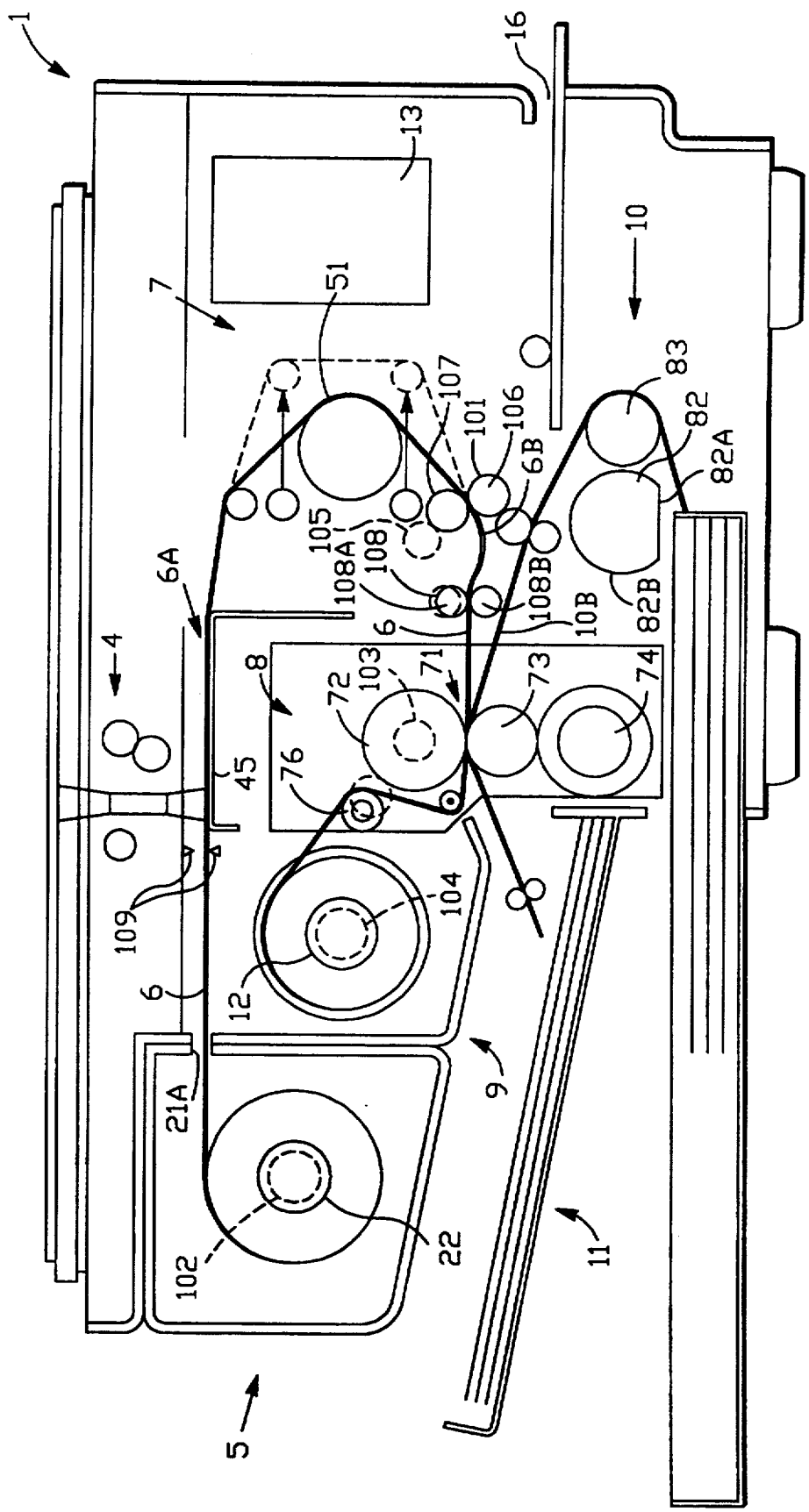
FIG. 6 is a sectional view of color image forming apparatus illustrating a fifth embodiment of this invention.

FIG. 6 illustrates a fifth embodiment of this invention which is similar in functionality to the first embodiment of FIG. 2 except for the location of feed roller assembly 101 and tension roller assembly 108 in transport path 6A. Feed roller assembly 101 is positioned downstream from development station 7, i.e., positioned between stations 7 and 8, and comprises member drive roller 106 and pressure roller 107 driven motor drive roller 105 and constitutes a secondary transport system. Tension roller assembly 108 is positioned in transport path 6A downstream from feed roller assembly 101. Feed assembly 101 is controlled by sensor system 109 disposed upstream from the exposure station 4 so that the transport speed of photosensitive receiving member 6 is maintained constant through station 4 and provides for the transport of member 6 to image transfer station 8 in a taut condition while forming a differential motion buffer between drive means 105 and drive means 103.

Figure 7:
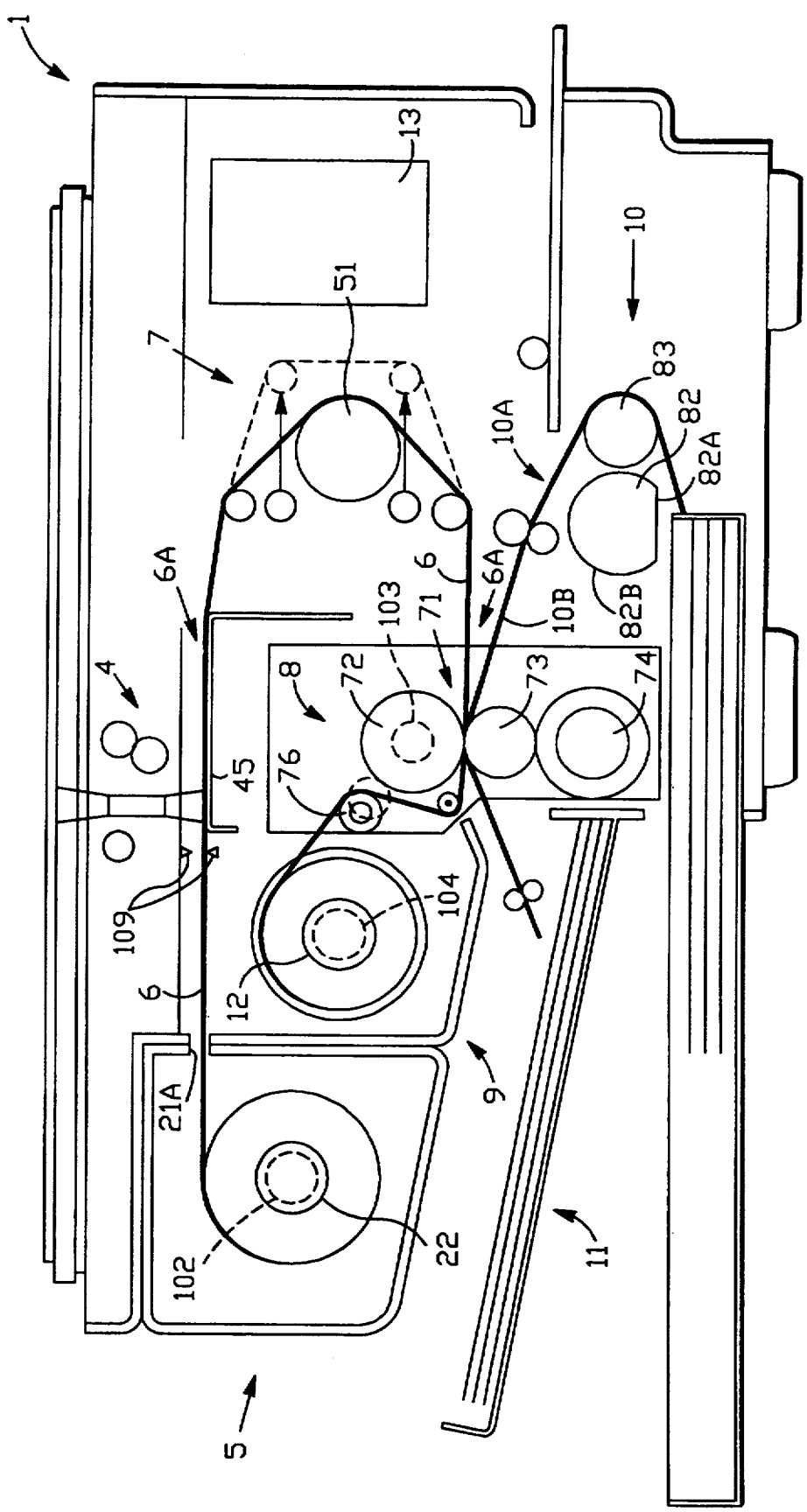
FIG. 7 is a sectional view of color image forming apparatus illustrating a sixth embodiment of this invention.

FIG. 7 illustrates a sixth embodiment of this invention wherein the primary transport system for photosensitive member 6 is drive motor 103 in transfer roller assembly 71, which is controlled by sensor system 109 positioned upstream of exposure station 4 in order to maintain the rate movement of photosensitive receiving member 6 constant through exposure station 4. Thus, in this embodiment, the transport of member 6 is accomplished by roller assembly 71, comprising a primary transport system, thereby eliminating the need for feed roller assembly 101 or a secondary transport system, such as, utilized in the fifth embodiment of FIG. 6, and instead, employs a sensor system for monitoring the rate of movement of member 6 through exposure station 6. Further, there is no slack condition or slack loop necessary in photosensitive receiving member 6 along any portion of transport path 6A, and the employment of slack compensating means in the form of tension roller assembly 108 or tension arm unit 111 are not required.

In the foregoing embodiments of this invention, supply roller 22, top roller 72, takeup roller 12, feed roller assembly 101 and tension roller assembly 108 may be configured such that these elements move between an engaged position and a retracted or released position. These elements are provided with a clutch mechanism which releases them for free rotation such that their engagement with member 6 or their regulation in the rate of movement of member 6 along transport path 6A may be relinquished as required. When photosensitive receiving member 6 is initially set into position, or is required to be rewound for purposes of repositioning unexposed portions, or finally rewound from takeup roller 12 back onto supply roller 22, these clutch mechanisms are operated to permit these elements to be placed in their released position.

Sensor system 109 is employed to monitor and regulate the rate of movement of member 6 to be uniform or constant through exposure station 4. Sensor system 109 is shown in the embodiments as being positioned upstream from station 4 but it may be also elsewhere, such as within station 4 or even downstream of station 4.

Figure 8:
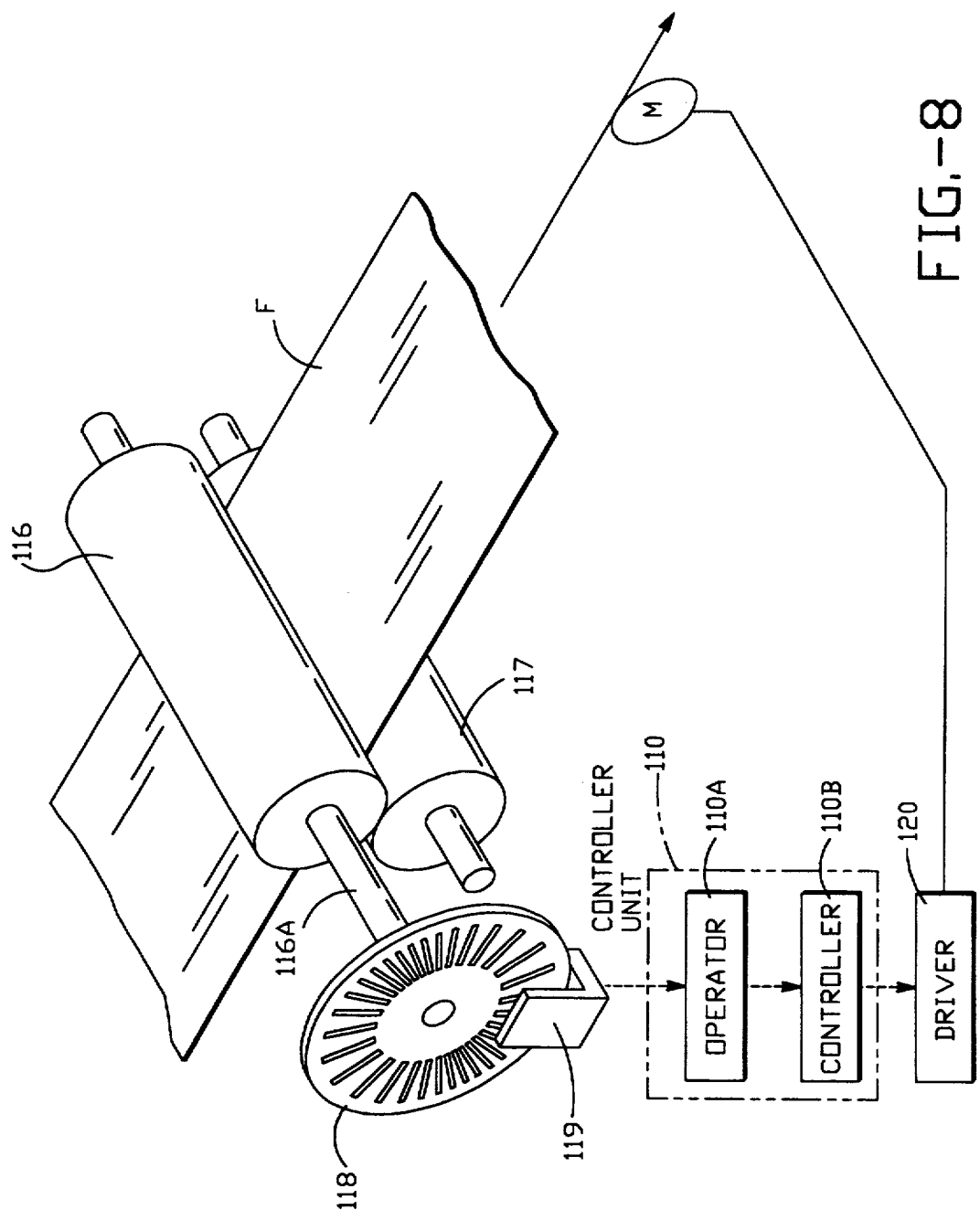
FIG. 8 is a perspective view of a motion sensor system positioned in proximity to the exposure station of the image forming apparatus.

FIG. 8 illustrates an embodiment of sensor system 109 positioned upstream or downstream relative to exposure station 4. As shown in FIG. 8, sensor system 109 is an optical encoder comprising a pair of upper and lower detection rollers 116 and 117 positioned such that member 6 moves between them. An apertured disc 118 is mounted for rotational movement with rotational axis 116A of upper detection roller 116. U-shaped, transmission type photosensor 119 is positioned to encounter and detect the rotational passage of apertures in disc 118 and convert them into a series of electrical pulses. As a result, the rate of movement of photosensitive receiving member 6 is detected by counting the number of pulses generated due to the rotational movement of disc 118 through the detection path of photosensor 119. Controller unit 110 is connected to photosensor 119 to receive the generated electrical pulses. The rate of movement of member 6 is determined from generated pulses by operator portion 110A of controller unit 110. Controller portion 110B produces a control signal to driver 120 of the drive motor controlling the speed of member 6 so that the rate of movement is maintained constant. The member drive motor in this case may be a primary or secondary transport system in the several embodiments herein, such as, drive motor 101 or 102 or 103 or 115. The rate of movement of member 6 may, alternatively, be detected by means of employing a potentiometer.

Figure 9:
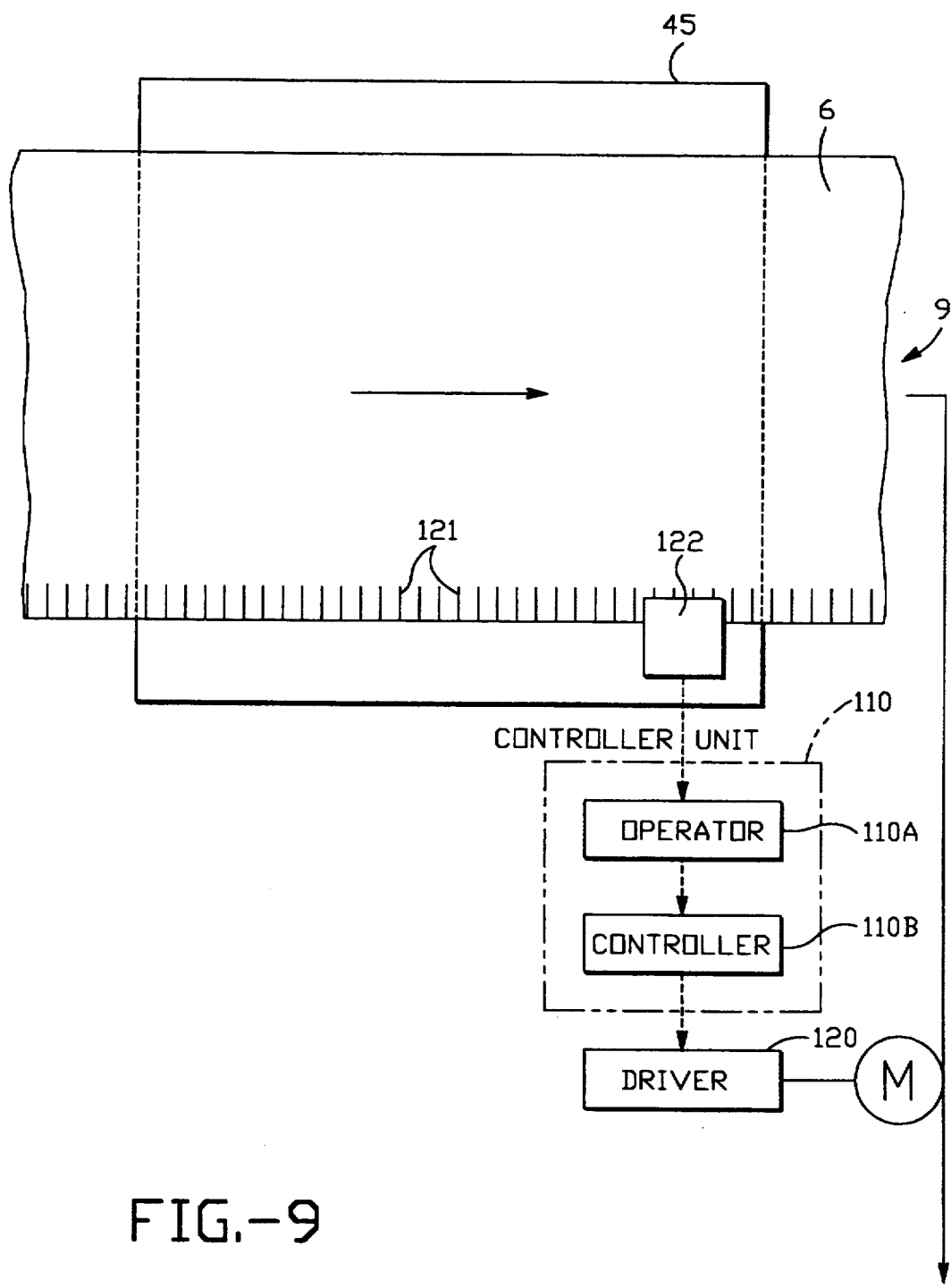
FIG. 9 is a perspective view of another motion sensor system positioned adjacent the path of a moving photosensitive receiving member within the confines of the exposure station of the image reproducing apparatus.

FIG. 9 illustrates another type of arrangement for monitoring and controlling the rate of movement of photosensitive receiving member 6 through exposure station 4. Sensor system 109 is positioned along one edge of photosensitive receiving member 6 to read a series of timing markings that have been previously formed along one edge of member 6. These markings form a line pattern 121 having fixed intervals along the length or longitudinal direction of member 6. The pattern is monitored by a reflective type photosensor 122. The photosensor 122 is mounted relative to exposure platform 45 in a manner to conveniently monitor the member edge and the passage of the timing markings. Controller unit 110 is responsive to electrical pulse signals developed at photosensor 122. Operator portion 110A of controller unit 110 calculates the rate of movement of member 6 based upon the number of passing markings (pulses) per unit time. Controller portion 110B provides an output signal in the form of drive pulses to driver 120 maintaining the member drive motor to operate at a constant rate of movement. The member drive motor in this case may be a primary or secondary transport system in the several embodiments herein, such as, drive motor 101 or 102 or 103 or 115.

While the present invention has been described in conjunction with several specific embodiments, it is evident to those skilled in the art that many further alternatives, modifications and variations will be apparent in light of the forgoing description. As an example, the foregoing embodiments all have dealt with a color image reproducing apparatus of the thermal type. The operation of this invention is also applicable to other apparatus, such as, other types of printers, plotters, facsimile apparatus and electronic cameras. Thus, the present invention described herein is intended to embrace all such alternatives, modifications, applications and variations as may fall within the spirit and scope of the appended claims.

What is claimed is:

1. An image forming apparatus for transporting a film type photosensitive member from a supply source along a transport path sequentially through exposure, heat developing, and pressure transfer sections, so as to first form a latent image on a surface of said photosensitive member, heat develop the formed latent image, and then transfer the developed image to a transfer member within said pressure transfer section, comprising:

primary transport means for transport of said photosensitive member at a first constant velocity, $V_1$, along said transport path positioned in the region of said pressure transfer section, secondary transport means downstream of said exposure section for continuous transport of said photosensitive member at a second constant velocity, $V_2$, along said transport path through said exposure section during both exposure and non-exposure periods of said exposure section, wherein the velocity, $V_2$ is above the velocity, $V_1$, for providing uniform tension in the continuous transport of said photosensitive member through said exposure section but producing slack in said photosensitive member in its travel in a portion of said transport path between said secondary transport means and said primary transport means, and tensioning means positioned in said transport path portion downstream from said secondary transport means and before said primary transport means for engaging said photosensitive member for maintaining the tension of said photosensitive member taut in its travel in said transport path portion through said heat developing section and said pressure transfer section due to the difference in the continuously maintained velocities of said first and second transport means.

2. The image forming apparatus of claim 1 further comprising:

holding means in said transport path portion immediately downstream from said tensioning means for applying a predetermined amount of tension to said photosensitive member for maintaining the tension of said photosensitive member taut in its travel in said transport path portion through at least one of said heat developing section and said pressure transfer section, and a slack loop formed in said photosensitive member between said tensioning means and said holding means due to the difference in the continuously maintained velocities of said first and second transport means.

3. A method of controlling the transport of a photosensitive member from a supply source along a transport path sequentially through exposure, heat developing, and pressure transfer sections, so as to first form a sequence of adjacently disposed latent images on a surface of said photosensitive member during the sequential exposure of the photosensitive member to a series of original images, heat develop the formed latent image, and then transfer the developed image to a transfer member within said pressure transfer section, said method comprising the steps of:

providing a primary transport driving means at the region of the pressure transfer section to move the photosensitive member continuously through the sections, continuously moving the photosensitive member at first constant velocity, $V_1$, through the heat developing section and the pressure transfer section by the primary transport means, providing a secondary transport means downstream of said exposure section, continuously moving the photosensitive member at second constant velocity, $V_2$, through the exposure section by the secondary transport means, causing the velocity, $V_2$ to be greater than the velocity, $V_1$, so that the movement of the photosensitive member through the exposure section is maintained at a uniform higher velocity during periods of both original image exposure as well as non-exposure between the adjacently disposed latent images, and buffering the transport between the primary and secondary transport means so that a slack loop is formed in its transport beyond the exposure section in order for maintaining the photosensitive member in a taut condition through the heat developing section and the pressure transfer section.

* * * * *